United States Patent [19]

Tomomura et al.

[11] Patent Number: 5,037,709

[45] Date of Patent: Aug. 6, 1991

[54] ELECTROLUMINESCENT DEVICE OF COMPOUND SEMICONDUCTOR

[75] Inventors: Yoshitaka Tomomura; Masahiko Kitagawa, both of Nara, Japan

[73] Assignee: Sharp Kabushiki Kaisha, Osaka, Japan

[21] Appl. No.: 382,238

[22] Filed: Jul. 19, 1989

[30] Foreign Application Priority Data

Jul. 21, 1988 [JP] Japan .................................. 63-182664
Sep. 26, 1988 [JP] Japan .................................. 63-240556

[51] Int. Cl.$^5$ .............................................. H01J 3/19
[52] U.S. Cl. ..................................... 428/690; 313/503; 313/509; 357/17; 428/901
[58] Field of Search ................... 428/690, 401; 357/17; 313/503, 506, 509, 512

[56] References Cited

U.S. PATENT DOCUMENTS

| | | |
|---|---|---|
| 4,644,551 | 2/1987 | Kawano et al. ........................ 357/17 |
| 4,706,254 | 11/1987 | Nojiri et al. .......................... 357/17 |
| 4,893,154 | 1/1990 | Hirai et al. ............................ 357/17 |

*Primary Examiner*—James J. Seidleck
*Attorney, Agent, or Firm*—Cohen, Pontani & Lieberman

[57] ABSTRACT

The present invention provides an electroluminescent device of Group II-VI compound semiconductor which comprises a substrate, a light-emitting portion, and a conductive portion provided at least between the substrate and the light-emitting portion for injecting into the light-emitting portion the current to be produced in the device by the application of an external voltage.

20 Claims, 7 Drawing Sheets

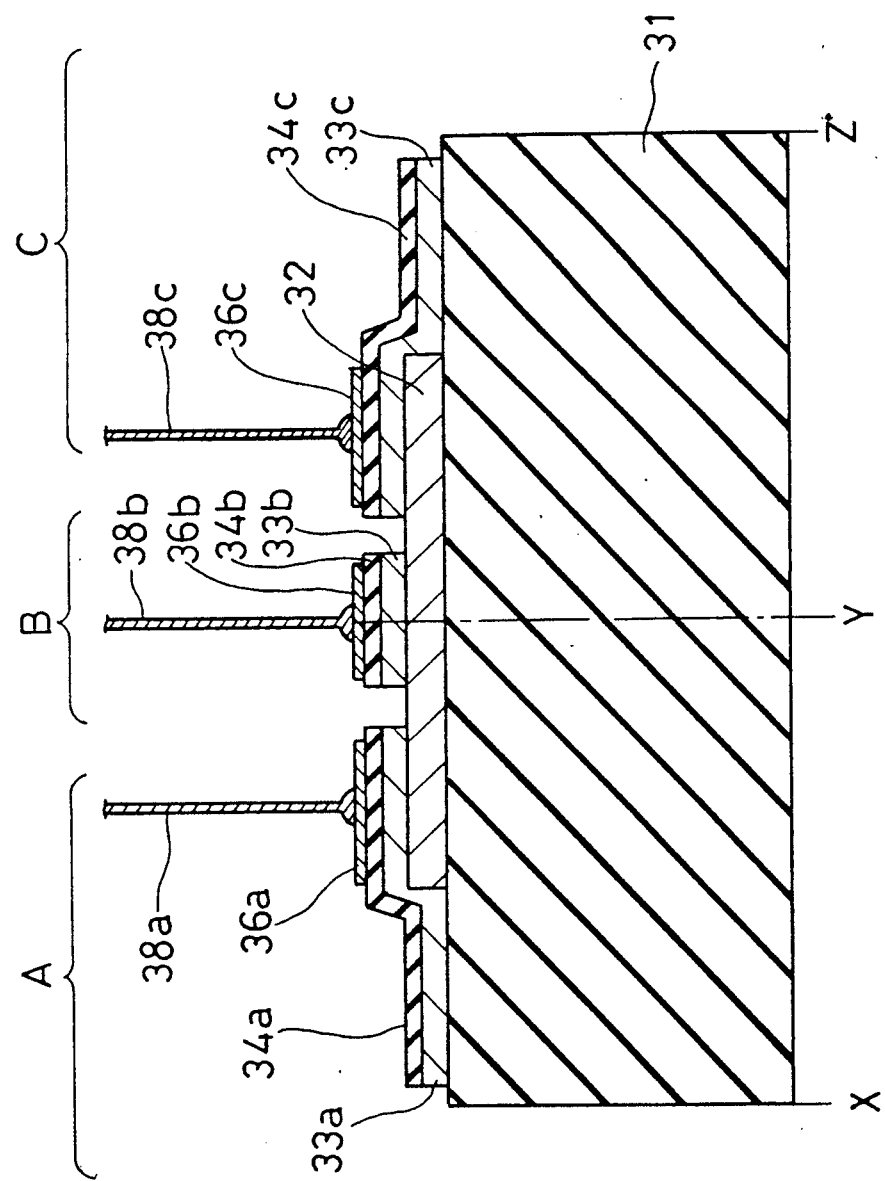

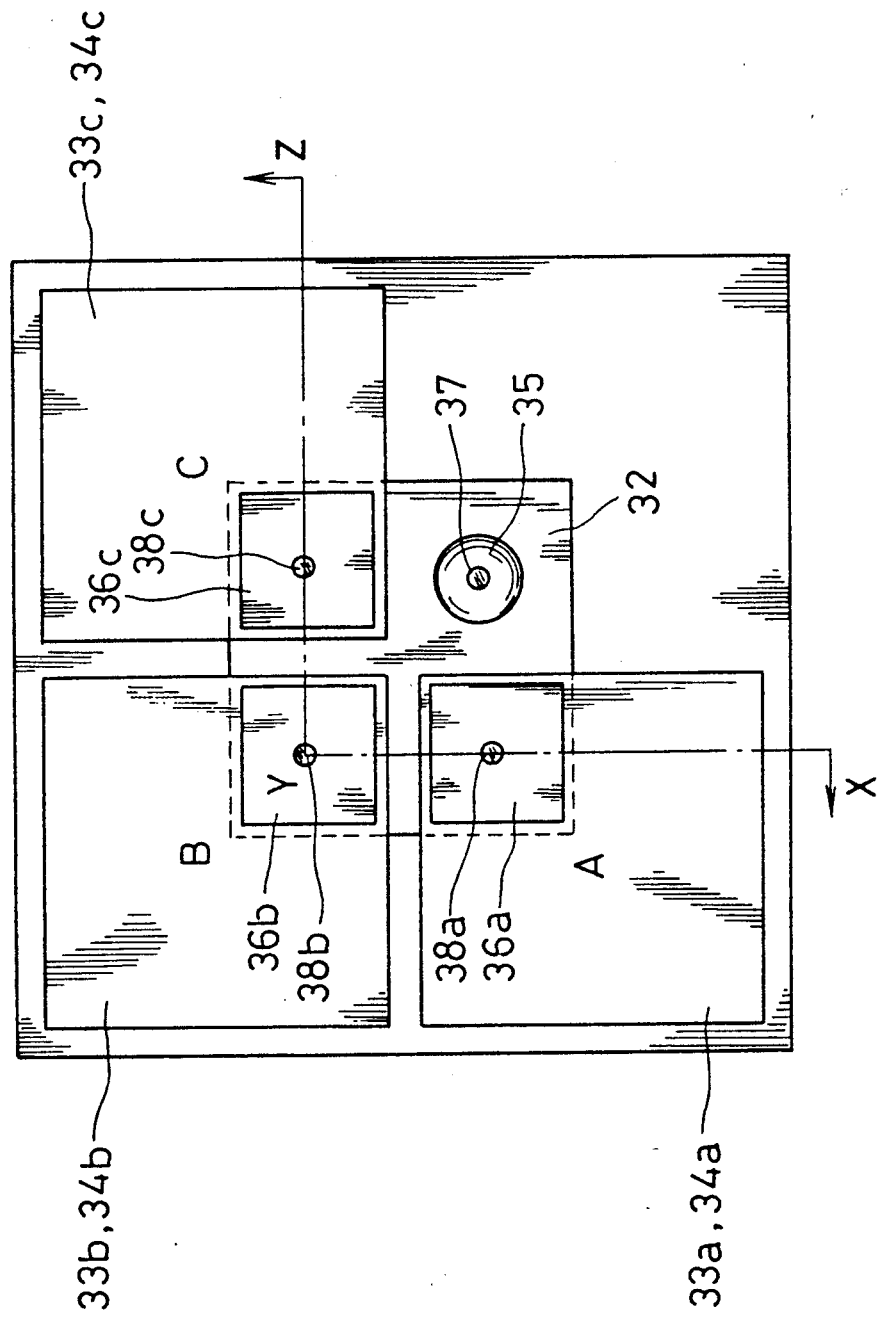

ELECTROLUMINESCENT DEVICE OF COMPOUND SEMICONDUCTOR

BACKGROUND OF THE INVENTION

1. Field of the Invention

The present invention relates to electroluminescent devices of compound semiconductors, and more particularly to improvements in electroluminescent devices comprising a Group II–VI compound semiconductor such as zinc sulfide (ZnS) or zinc selenide (ZnSe).

2. Description of the Prior Art

Group II–VI compound semiconductors such as ZnS and ZnSe are generally used as materials for devices, such as blue light emitting diodes, for producing light with high efficiency over the region of ultraviolet rays to visible rays.

FIG. 10 shows an example of structure conventionally used for electroluminescent devices of such a Group II–VI compound semiconductor. Indicated at 71 is a low-resistance n-type ZnS single-crystal substrate prepared from a ZnS bulk single crystal grown by the halogen chemical transport process, by heat-treating the crystal in molten zinc at 1000° C. for 100 hours. A light-emitting layer 74 of n-type ZnS and an insulating layer 75 of insulating ZnS are successively formed epitaxially over the substrate 71 by molecular beam epitaxy (MBE) or organometallic chemical vapor deposition (MOCVD) Gold (Au) is deposited on the insulating layer 75 by vacuum evaporation to form a positive electrode 77. An ohmic electrode of indium (In) serving as a negative electrode 78 is formed on the rear surface of the low-resistance n-type substrate 71. Thus, an MIS (metal insulator semiconductor) electroluminescent device is fabricated.

Also proposed is an electroluminescent device wherein a conductive layer is provided between a substrate and a light-emitting layer.

With reference to FIG. 11, the proposed device comprises a low-resistance n-type ZnS substrate 83 having a resistivity of 10 to 1 ohm-cm and a thickness of 300 to 1000 $\mu$m, a low-resistance n type ZnS conductive layer 84 having a resistivity of $10^{-2}$ to $10^{-3}$ ohm cm and epitaxially formed over the substrate 83, for example, by MBE from ZnS with Al, Cl or the like added thereto, a low-resistance n-type ZnS light emitting layer 85 and a ZnS high resistance layer 86 which are formed successively over the layer 84, for example, by MBE, an ohmic electrode 82 formed on the rear surface of the substrate 83 by depositing In thereon by vacuum evaporation and heat-treating the deposit in a high-purity gas atmosphere at 450° C. for several seconds to several minutes, an electrode 87 formed on the high resistance ZnS layer 86 by depositing Au thereon by vacuum evaporation, and lead wires 81 and 88 suitably arranged.

With these conventional electroluminescent devices, the current injected via the electrodes 77, 78 or 82, 88 flows through the device over a wide region, so that the current density in the light-emitting layer 74 or 85 is small. This makes t difficult to obtain luminescence with high brightness. Furthermore, the light produced by the emitting layer 74 or 85 radiates through the device in every direction. It is therefore likely that the light produced will not be taken out of the device efficiently.

Either one of the foregoing constructions of electroluminescent devices may be used for fabricating a monolithic display device which comprises a multiplicity of minute luminescent chips having a unit size of 100 $\mu$m and prepared by forming a minute discrete pattern on the substrate. When current is passed through the device, a majority of current loss occurs in the substrate. It is therefore likely that the device is high in series resistance of the chips and has an impaired insulating property between the chips.

An object of the present invention, which has been accomplished in view of the foregoing situation, is to provide an electroluminescent device of Group II–VI compound semiconductor adapted to produce light with high brightness.

SUMMARY OF THE INVENTION

The present invention provides an electroluminescent device of compound semiconductor which comprises an electroluminescent device body formed on a substrate and providing a light-emitting portion and a conductive portion joined to the lower surface and/or the upper surface of the light-emitting portion, and a pair of electrodes for applying therethrough an external voltage to the body to cause electroluminescence, the light-emitting portion and the conductive portion being each formed of a Group II–VI compound semiconductor made to have substantially low resistance by the addition of the same or different impurity elements for the two portions, the device body being substantially in the form of a column provided upright on the substrate and surrounded by an insulating portion over the entire side surface thereof, the insulating portion being formed of a Group II–VI compound semiconductor and being equivalent to or lower than the light-emitting portion and/or the conductive portion in refractive index.

Thus, the present invention provides an electroluminescent device of a Group II–VI compound semiconductor which comprises a substrate, a light-emitting portion, and a conductive portion provided at least between the substrate and the light emitting portion for injecting into the light-emitting portion the current to be produced in the device by the application of an external voltage. The device body including the light-emitting portion and the conductive portion is in the form of a column and has its side surface surrounded by an insulating layer so that the current to be injected into the light-emitting portion can be confined to the columnar conductive portion and injected into the columnar light-emitting portion at a high density to produce light with high brightness.

Further when the insulating portion is prepared from the same Group II–VI compound semiconductor as is used for the device body, the device body can be free of the adverse effect that could otherwise result from differences between the insulating portion and the light-emitting and conductive portions in properties such as the lattice constant and coefficient of thermal expansion.

In the case where the insulating portion is given a lower refractive index than the device body, the light produced by the light-emitting portion can be confined to the columnar conductive portion surrounded by the insulating portion and can therefore be delivered from the device toward a specified direction with a high efficiency.

BRIEF DESCRIPTION OF THE DRAWINGS

FIG. 7 is a diagram showing the structure of an electroluminescent device having a plurality of electrodes on the body of the device;

FIG. 8 is a view in section taken along the line X-Y-Z in FIG. 7;

DESCRIPTION OF THE PREFERRED EMBODIMENTS

Figure 1:
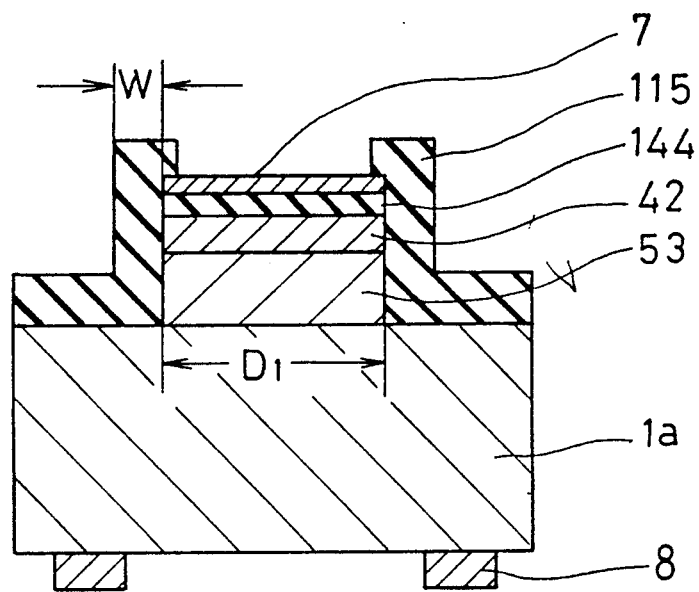
FIG. 1 is a diagram showing the structure of a first embodiment of the invention.

The electroluminescent device of the present invention is prepared from a Group II-VI compound semiconductor. The light emitted by the light-emitting portion by the application of a voltage across the electrodes has a multiplicity of colors including blue and appears on the upper surface or lower surface of the device. The device is used as a light source having high energy and high brightness for various displays, printers, facsimile systems, etc.

The greatest structural feature of the compound semiconductor device of the invention is that an electroluminescent device body comprising a light-emitting portion and a conductive portion joined to the lower surface and/or the upper surface of the light-emitting portion has a columnar structure and that the device body has its side surface entirely surrounded by an insulating portion which is equivalent to or lower than the device body in refractive index.

The substrate for use in the invention is preferably made of a Group II-VI compound semiconductor. Examples of such semiconductors are low-resistance n-type ZnS, low-resistance n type ZnSe, low resistance n-type $ZnS_xSe_{1-x}$ and the like, and insulating ZnS, insulating ZnSe, insulating $ZnS_xSe_{1-x}$ and the like.

For example, the substrate of low-resistance n-type ZnS (or low-resistance n type ZnSe or low-resistance n-type $ZnS_xSe_{1-x}$) is prepared from a ZnS bulk single crystal (or ZnSe bulk single crystal or $ZnS_xSe_{1-x}$ bulk single crystal) grown by the halogen chemical transport process, by heat-treating the single crystal in molten zinc at 1000° C. for about 100 hours. The substrate thus obtained is made to have a low resistance. Preferably, the above materials forming the substrate have the following resistivities (ohm-cm).

ZnS: 1 to 10, more preferably about 1.
ZnSe: $10^{-2}$ to 10, more preferably about 1.
$ZnS_xSe_{1-x}$: 1 to 10, more preferably about 1.

Examples of n-type impurities useful for heat treatment in preparing the substrates are Al, Ga and the like, Cl and Br. Also usable are In, I and the like.

For preparing the substrate of insulating ZnS (or insulating ZnSe or insulating $ZnS_xSe_{1-x}$), it is desirable to use a ZnS bulk single crystal (or ZnSe bulk single crystal or $ZnS_xSe_{1-x}$ bulk single crystal) as is without subjecting the crystal to low-resistance treatment.

When a $ZnS_{0.5}Se_{0.5}$ crystal which is grown by the halogen chemical transport process or high-pressure melting process is used, the substrate obtained is colored yellow or orange and is low in transparency for the luminescence wavelength, so that the blue light produced, for example, needs to be taken out from the semiconductor side. However, if a $ZnS_{0.5}Se_{0.5}$ crystal which is grown by the sublimation process is used, the resulting substrate is almost colorless and transparent and is desirable since blue light emitted can be taken out also from the substrate side. The substrate to be used in this case need not be subjected to the low-resistance treatment conventionally employed, but the wafer obtained from a bulk single crystal can be used as is, i.e. with its high resistivity (with insulating to semi-insulating property, $10^6$ to $10^{15}$ ohm cm).

The light-emitting portion to be formed in the present invention is preferably an n-type ZnS light-emitting layer providing a ZnS electroluminescent device of the MIS (metal insulator semiconductor) type, or a light-emitting layer having a p-n junction provided by the combination of n type ZnSe and p-type ZnSe for providing a p-n junction electroluminescent device of the planar structure type.

In the case of the MIS-type electroluminescent device, the Group II-VI compound semiconductor for the light-emitting layer is not limited to ZnS; also usable is, for example, ZnSe, $ZnS_xSe_{1-x}$ or $ZnS_yTe_{1-y}$. When the light-emitting layer is of the p-n junction type, use of a ZnSe p-n junction is not limitative; also usable are a ZnS p-n junction, a $ZnS_xSe_{1-x}$ p-n junction, a $ZnS_yTe_{1-y}$ p-n junction, p-n heterojunctions afforded by such materials, and various other junctions.

According to the present invention, the conductive layer which is made to have a substantially low resistance by the addition of impurity means one having a resistivity of 1 to $10^{-2}$ ohm-cm. This resistivity is controllable by setting the concentration of impurity added to $10^{16}$ to $10^{18}$ at.cm$^{-3}$, whereby the electric resistance is settable to a range useful for electroluminescent devices.

Examples of n-type impurities for use in preparing the conductive layer and the light-emitting layer are elements from Group III such as boron (B), aluminum (Al), gallium (Ga), indium (In) and thallim (Tl), and elements from Group VII such as chlorine (Cl), bromine (Br), fluorine (F) and iodine (I). At least one of these elements is used, or at least one of such elements from Group III is used in combination with at least one of these elements from Group VII. On the other hand, examples of useful p-type impurities are elements from Group Ia such as lithium (Li), sodium (Na), potassium (K), rubidium (Rb) and cesium (Cs), the elements from Group Ib, i.e. copper (Cu), silver (Ag) and Gold (Au), thallium from Group III and elements from Group V such as nitrogen (N), phosphorus (P), arsenic (As), antimony (Sb) and bismuth (Bi). At least one of these elements is used, or at least one of the above elements from Group Ia or Ib is used in combination with at least one element from Group V. These impurities are suitable for giving epitaxial films which are small in the degree of compensation and have a high quality.

Figure 2:
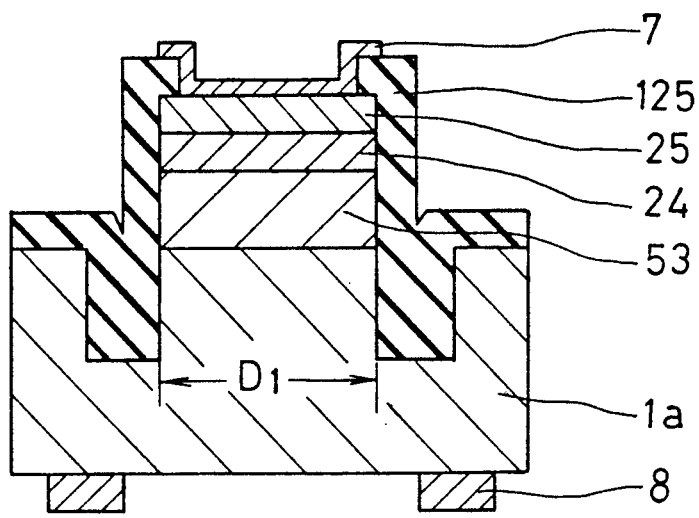
FIGS. 2 to 4 are diagrams showing the structures of third, fifth and seventh embodiments of the invention, respectively.

For devices (chips) measuring, for example, 300 $\mu m \times 300 \mu m$, desirable examples of device bodies of the invention include one in the form of a solid cylinder which is about 30 to about 100 $\mu m$ (preferably 50 $\mu m$) in diameter D1 as seen in FIGS. 1 and 2.

The insulating portion is, for example, an insulating layer made of a Group II-VI compound semiconductor such as ZnS, ZnSe or $ZnS_xSe_{1-x}$. CaS, CaSe, SrS and SrSe are also usable for the insulating portion. The insulating portion is preferably $10^{10}$ to $10^{15}$ ohm cm, more preferably $10^{15}$ ohm-cm, in resistivity. The insulating layer has a wall surrounding the device body over the entire side surface thereof. The surrounding wall is preferably 2 to 10 µm, more preferably 5 µm, in thickness W (see FIG. 1). The insulating layer is formed by molecular beam epitaxy (MBE). More specifically, the insulating layer is formed to a specified thickness on the side surface of the device body prepared on the substrate, for example, by disposing the substrate as inclined at a predetermined angle to the direction of incidence of a material molecular beam of Zn and Se, and projecting the material onto the device body while rotating the substrate to thereby grow insulating ZnSe.

Figure 9:
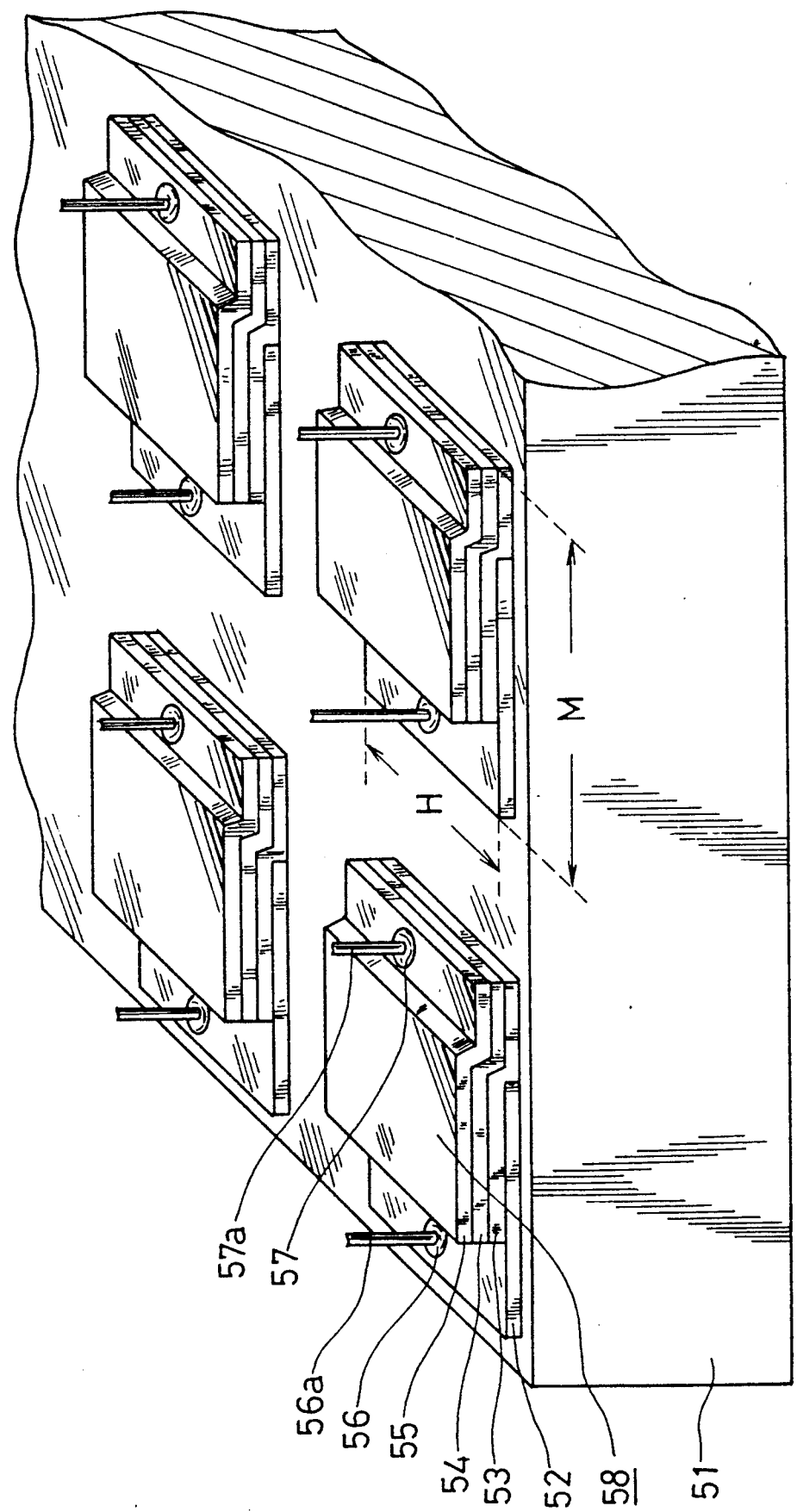
FIG. 9 is a fragmentary perspective view of an electroluminescent display having a large area and incorporating a plurality of electroluminescent devices, each of the devices having a pair of electrodes on its body.

According to the invention, the device body is fabricated by forming epitaxial compound semiconductor layers one over another on the compound semiconductor substrate. While the above mentioned cylindrical device body is desirable, also suitable as the device body is one measuring 50 to 500 µm in width, 80 to 800 µm in length and 2 to 15 µm in thickness. Although one device body may be formed on the substrate, a multiplicity of device bodies can be provided thereon in a scattered arrangement to constitute a monolithic electroluminescent display or large-area electroluminescent display. FIG. 9 shows a monolithic electroluminescent display including compound semiconductor electroluminescent devices 58 each having an insulating ZnSe substrate 51, an electroluminescent device body formed on the substrate 51 and comprising a p-type ZnSe conductive layer 52, a p-type ZnSe light-emitting layer 53, an n-type ZnSe light-emitting layer 54 and an n-type ZnSe conductive layer 55 (an insulating layer surrounding the device body is not shown, the same as hereinafter) which are formed one over another, an Au positive electrode 56 provided on the conductive layer 52, and an In negative electrode 57 provided on the conductive layer 55 forming the uppermost layer of the device body. Indicated at 56a and 57a are lead wires. The device 58 on the substrate measures 450 µm in width H and 750 µm in length M. The display has 24×24 electroluminescent devices as arranged separately from one another in the form of a matrix. An arrangement of such displays provides a large-area electroluminescent display apparatus.

Figure 5:
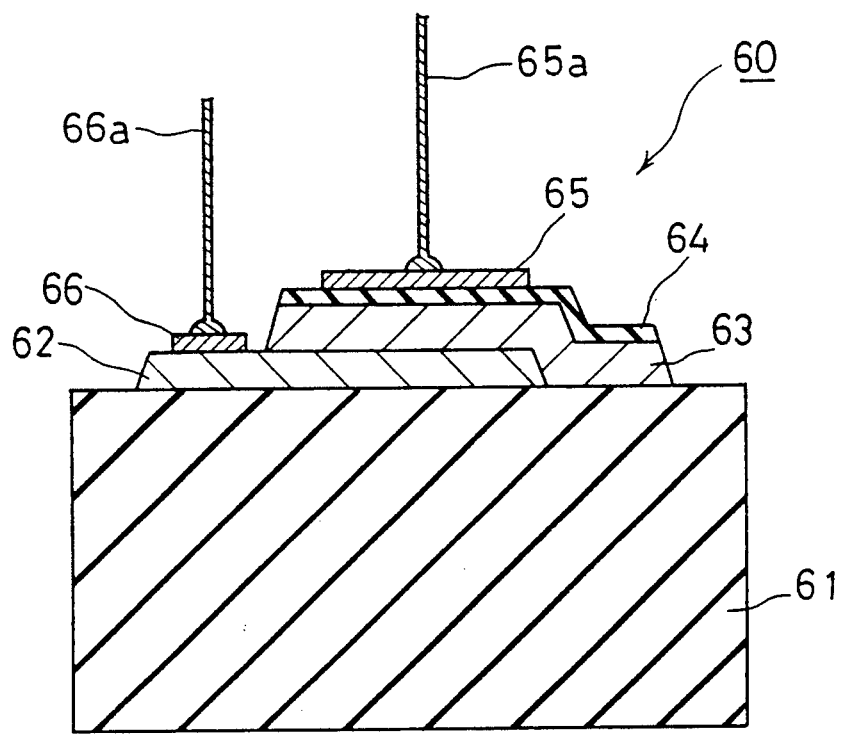
FIGS. 5 and 6 are diagrams showing the structures of electroluminescent devices each having a pair of electrodes on the body of the device.

FIG. 5 shows a MIS-type electroluminescent device 60 having a high-resistance layer formed on a light-emitting layer. More specifically, the device 60 comprises an insulating ZnS substrate 61, a device body formed on the substrate and having an n-type ZnS conductive layer 62 and an n-type ZnS light-emitting layer 63 on the layer 62, a ZnS high-resistance layer 64 formed on the light-emitting layer 63, an Au positive electrode 65 provided on the layer 64, and an In negative electrode 66 provided on the conductive layer 62. Indicated at 65a and 66a are lead wires.

Figure 6:
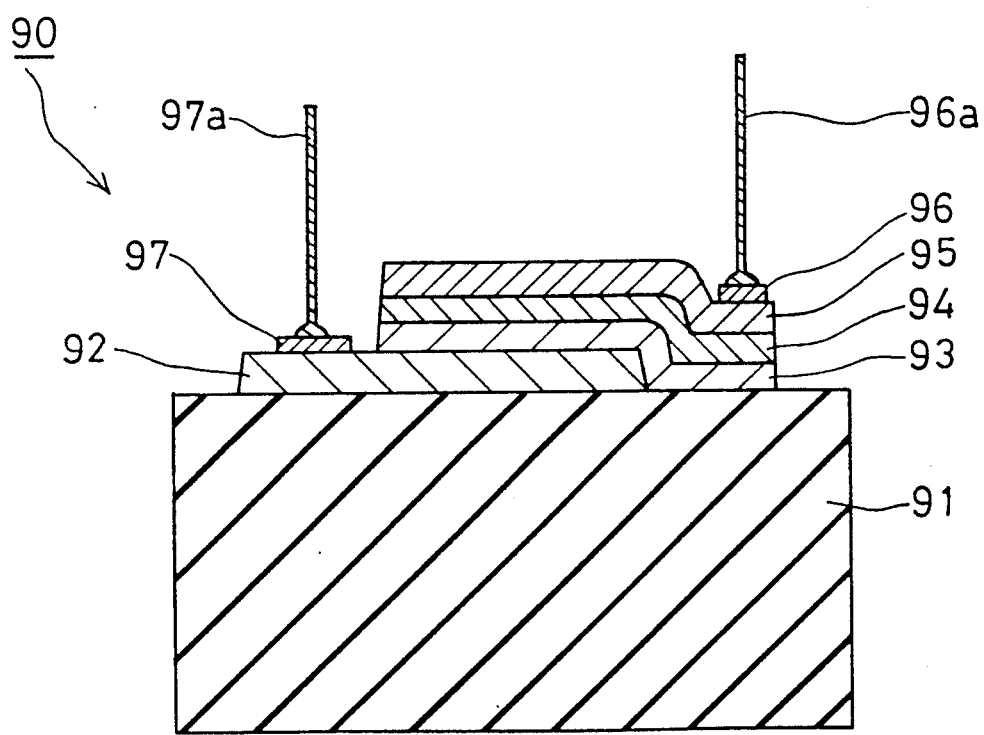
Figure 10:
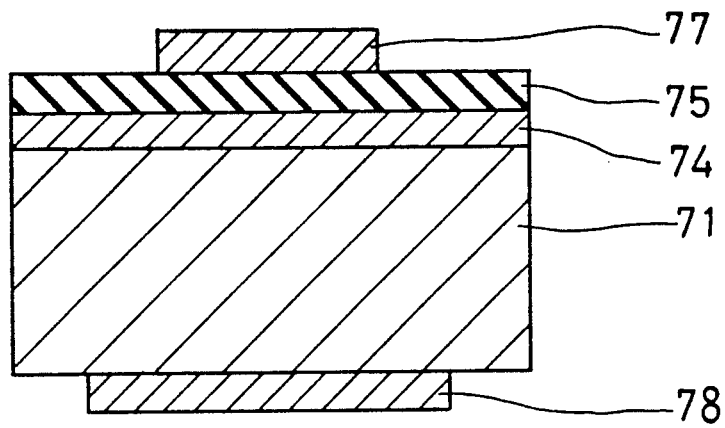
FIGS. 10 and 11 are diagrams showing the structures of conventional devices.
Figure 11:
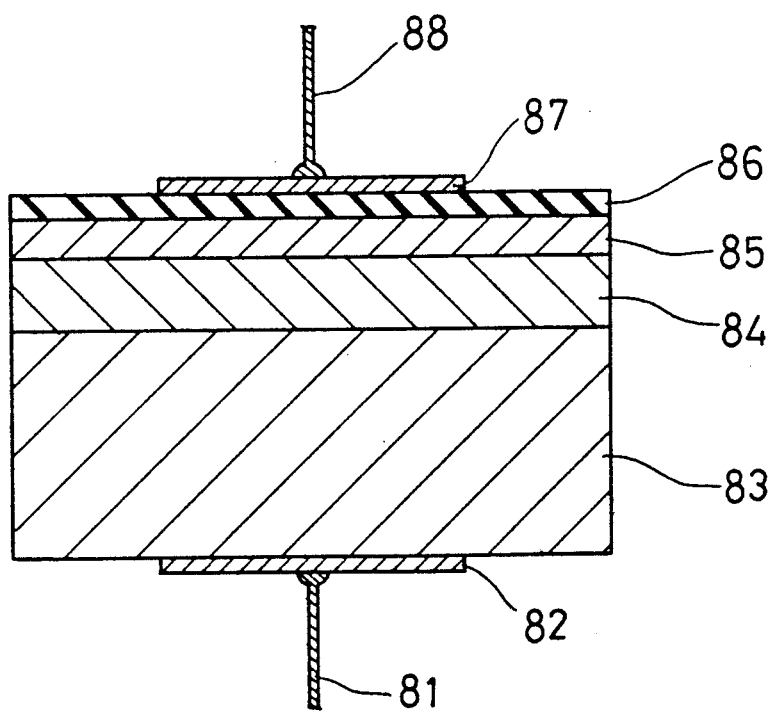

FIG. 6 shows an electroluminescent device 90 of the p-n junction type. The device 90 comprises an insulating ZnSe substrate 91, a device body formed on the substrate and comprising an n-type ZnSe conductive layer 92, an n-type ZnSe light emitting layer 93, a p-type ZnSe light emitting layer 94 and a p-type ZnSe conductive layer 95 which are formed one over another, an Au positive electrode 96 provided on the conductive layer 95, and an In negative electrode 97 provided on the conductive layer 92. Indicated at 96a and 97a are lead wires.

With the devices shown in FIGS. 5 and 6, the electrodes 66, 65 or 97, 96, like the electrodes 56, 57 of FIG. 9, are arranged respectively in an electrode forming space on the conductive layer and on the uppermost layer of the device body (on the conductive layer 55 in FIG. 9, on the high-resistance layer 64 in FIG. 5, or on the conductive layer 95 in FIG. 6) for applying a voltage therethrough to the device body.

When the electrodes are thus provided on the device body, the voltage which would otherwise be applied via the substrate can be efficiently applied to the device body. This precludes the loss due to the substrate to result in the following advantages.

(1) The reduced resistance between the electrodes makes it possible to provide a compound semiconductor electroluminescent device free of a loss and having high brightness.

(2) Monolithic electroluminescent displays and large-area electroluminescent displays can be provided which comprise a multiplicity of minute electroluminescent chips arranged on a substrate with satisfactory insulation between the chips and reduced series resistance for producing multicolor light including blue light.

Such a compound semiconductor electroluminescent device is fabricated by placing a mask having a specified rectangular aperture on a high-resistance compound semiconductor substrate, for example of $10^6$ to $10^{15}$ ohm-cm, forming a low-resistance semiconductor conductive layer as the lowermost layer first on the substrate, and forming a compound semiconductor light-emitting layer, and a compound semiconductor high-resistance layer or a compound semiconductor conductive layer as superposed layers on the resulting conductive layer except at an electrode forming site. The layers are formed, for example, by MBE. Depending on how the mask is handled, the device is prepared in this way by one of the following two processes.

The first of the processes comprises placing a mask of thin metal film having at least one specified rectangular aperture on the compound semiconductor substrate, epitaxially growing a compound semiconductor conductive layer first as the lowermost layer, then shifting the mask so as to cover the electrode forming site on the layer with the mask, forming a compound semiconductor light-emitting layer on the conductive layer, further epitaxially growing a compound semiconductor high-resistance layer or compound semiconductor conductive layer on the light-emitting layer to obtain a device body, removing the mask and thereafter providing electrodes at the electrode forming site on the lowermost conductive layer and on the surface of the uppermost high-resistance layer or conductive layer.

The second process comprises placing a mask of thin metal film having at least one specified rectangular aperture over the compound semiconductor substrate at a specified distance (which is usually 10 to 500 µm to be suitable) away therefrom, epitaxially growing a compound semiconductor conductive layer first, then altering the angle of inclination of the substrate provided with the mask (generally suitably by 5 to 45 degrees) with respect to the direction of projection of the molecular beam to mask an electrode forming site on the conductive layer, forming a compound semiconductor light-emitting layer on the conductive layer, further epitaxially growing a compound semiconductor high-resistance layer or compound semiconductor conductive layer on the resulting layer to obtain a device body, removing the mask and providing electrodes at the electrode forming site on the lowermost conductive layer and on the surface of the uppermost high-resistance layer or conductive layer.

The electroluminescent device body thus obtained comprises epitaxial compound semiconductor layers which are all identical in shape when seen from above. It is suitable that the electrode forming site on the lowermost layer be usually 5 to 80% of the surface of the lowermost layer in area.

The processes described above are very useful for epitaxially forming compound semiconductor layers. Moreover, the use of a high resistance compound semiconductor, especially bulk single crystal, as it is for the compound semiconductor substrate as already described and shown in FIGS. 9, 5 and 6, facilitates separation of unit electroluminescent devices which are to be obtained collectively in the form of a single chip.

Finally, FIGS. 7 and 8 show a ZnS multicolor electroluminescent device of the MIS type similar to the one shown in FIG. 5. with reference to FIGS. 7 and 8, the device comprises a semi insulating (high resistance) ZnS substrate 31, a low-resistance n-type epitaxial ZnS conductive layer 32, low-resistance n type epitaxial ZnS light-emitting layers 33a, 33b, 33c, hole injecting epitaxial ZnS high-resistance layers 34a, 34b, 34c, an ohmic metal (In) electrode 35 formed on the conductive layer 32, metal (Au) electrodes 36a, 36b, 36c formed on the respective high resistance layers 34a, 34b, 34c, and metal lead wires 37, 38a, 38b, 38c. This device is prepared by placing a mask of thin metal plate having a rectangular aperture on the semi insulating (high-resistance) ZnS substrate 31, growing the conductive layer 32 by MBE, thereafter growing the light-emitting layer 33a and the high-resistance layer 34a in overlapping relation with the conductive layer 32 by MBE with the mask shifted to form a light emitting portion A, similarly forming light-emitting portions B and C in succession with the mask further shifted, and providing the electrodes 35, 36a, 36b and 36c. The device thus formed includes the three light-emitting portions A, B and C having the conductive layer 32 n common. The light-emitting layers of the respective light-emitting portions have added thereto as impurities Al and Ag at about one-tenth the concentration of Al, Al and Cu at about one-tenth the concentration of Al, and Al and cadmium (Cd) at one-half the concentration of Al, respectively.

When voltage was applied to the respective light-emitting portions of the device obtained, blue, green and red luminescences were observed with high brightness. Multicolor light was produced by controlling the voltage applied to the three light emitting portions.

EXAMPLE

FIG. 1 is a diagram showing an electroluminescent device as a first embodiment of the invention.

Indicated at 1a is an n-type ZnSe substrate having a resistivity of about 1 ohm-cm prepared from a ZnSe bulk single crystal grown by the halogen chemical transport process, by heat-treating the crystal in molten zinc at 1000° C. for 100 hours to reduce the resistance. A mask having a circular aperture with a diameter of 30 to 100 μm is placed on the substrate 1a, and layers are epitaxially formed one over another on the substrate by MBE. These layers are a conductive layer 53 of low-resistance n-type ZnSe having an impurity concentration of at least $10^{18}$ cm$^{-3}$, a light-emitting layer 42 of n-type ZnSe having an impurity concentration of about $5 \times 10^{16}$ cm$^{-3}$, and a hole injecting insulating layer 144 of insulating ZnSe. A positive electrode 7 is then formed by depositing gold (Au).

Since the starting material molecular beam for MBE is directional, the substrate is disposed perpendicular to the direction of incidence of the beam for each starting material, whereby the device body can be grown in the form of a solid cylinder, 30 to 100 μm in diameter, with good controllability locally at the position on the substrate corresponding to the circular aperture in the mask.

With the mask thereafter removed, an insulating layer 115 of insulating ZnSe is epitaxially grown. This layer is grown over the side surface and top face of the cylindrical device body to a large thickness while rotating the substrate as inclined with respect to the direction of incidence of each molecular beam.

Subsequently, the excessive insulating ZnSe deposited on the positive electrode 7 is removed as by chemical etching, and an annular ohmic electrode of In serving as a negative electrode 8 is formed on the rear surface of the substrate 1a to complete a MIS-type electroluminescent device.

With the present embodiment, current through the device is confined to the solid cylindrical device body and can be injected into the light emitting layer at a high density. The embodiment thus realizes a ZnSe MIS-type electroluminescent device of high brightness.

With a second embodiment of the invention, the semiconductors for forming the substrate and the electroluminescent device body are each ZnS or zinc sulfo-selenide (ZnS$_x$Se$_{1-x}$). The MIS-type device of this embodiment also produces light with high brightness.

FIG. 2 is a diagram showing a third embodiment of the invention. With reference to this drawing, epitaxially formed on the same low-resistance ZnSe substrate 1a as used in the first embodiment are a conductive layer 53 made of n-type ZnSe and having an impurity concentration of $10^{18}$ cm$^{-3}$, a light-emitting layer 24 made of n-type ZnSe and having an impurity concentration of $10^{17}$ cm$^{-3}$, and a light-emitting layer 25 made of p-type ZnSe and having a hole concentration of $10^{16}$ cm$^{-3}$. These layers are grown one over another by MOCVD or MBE.

Next, the grown layer block and the substrate are partially etched away, for example, by chemical etching or reactive ion beam etching to form an electroluminescent device body in the form of a solid cylinder, 50 μm in diameter. Insulating ZnS$_x$Se$_{1-x}$ is thereafter grown epitaxially over the device body to form an insulating layer 125.

The insulating ZnS$_x$Se$_{1-x}$ is controlled to a sulfur content (x) of about 0.3 to 0.7 so as to have a sufficiently lower refractive index than the ZnSe forming the device body including the light-emitting layers 24, 25, with the difference in lattice constant therebetween diminished.

Subsequently, the insulating ZnS$_x$Se$_{1-x}$ portion formed over the light emitting layer 25 is etched away, and an ohmic electrode of Au is formed over the exposed layer 25 to provide a positive electrode 7. An ohmic electrode of In is formed on the rear surface of the substrate 1a to provide a negative electrode 8. Consequently, a p-n junction electroluminescent device is obtained.

Like the first embodiment, the present embodiment is adapted to permit current to flow into the light-emitting layers 24, 25 at an increased density, while the insulating layer 125 is lower in refractive index than the device body including the light-emitting layers 24, 25, with the result that the light produced by these layers 24, 25 is confined in the device body and can be delivered through the substrate. Thus, the ZnSe p-n junction device fabricated produces light with high brightness and high delivery efficiency.

Further according to a fourth embodiment, the Group II-VI compound semiconductor for forming the substrate and the device body is $ZnS_xSe_{1-x}$ $(0.5>x>0)$, and the insulating layer is formed of $ZnS_zSe_{1-z}$ having about 0.5 higher sulfur content (z) than the $ZnS_xSe_{1-x}$. Like the third embodiment, this embodiment, i.e. $ZnS_xSe_{1-x}$ p-n junction electroluminescent device, exhibits high brightness and achieves a high delivery efficiency.

Figure 3:
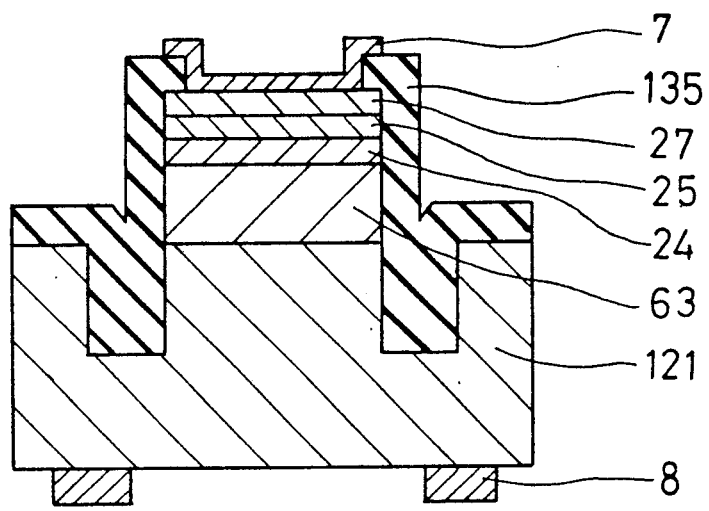

FIG. 3 is a diagram showing a fifth embodiment of the invention.

With reference to the drawing, an n-type $ZnS_xSe_{1-x}$ substrate 121 having a resistivity of about 1 ohm-cm is prepared from a $ZnS_xSe_{1-x}$ bulk single crystal grown by the halogen chemical transport process, by heat-treating the crystal in molten zinc at 1000° C. for 100 hours to reduce the resistance. On this substrate are successively epitaxially formed by MOCVD or MBE a conductive layer 63 of n-type $ZnS_xSe_{1-x}$ having an impurity concentration of $10^{19}$ cm$^{-3}$, a light-emitting layer 24 of n-type ZnSe having an impurity concentration of $10^{17}$ cm$^{-3}$, a light-emitting layer 25 of p-type ZnSe having a hole concentration of $10^{16}$ cm$^{-3}$, and a conductive layer 27 of p-type $ZnS_xSe_{1-x}$ having a hole concentration of $5 \times 10^{17}$ cm$^{-3}$.

Next in the same manner as in the third embodiment, the layer block obtained is etched to form an electroluminescent device body in the form of a solid cylinder. Subsequently, insulating $ZnS_ySe_{1-y}$ is epitaxially grown over the device body in the same manner as in the first and third embodiments to form an insulating layer 135 surrounding the device body, followed by formation of a positive electrode 7 of Au and a negative electrode 8 of In to fabricate a p-n junction electroluminescent device.

In the above process, the sulfur content (x) of $ZnS_xSe_{1-x}$ for forming the n-type and p-type conductive layers 63, 27 is adjusted to about 0.1 so that the semiconductor is about 0.1 eV greater than the ZnSe forming the emitting layers 24, 25 in band gap. The sulfur content (y) of $ZnS_ySe_{1-y}$ for forming the insulating layer 135 is adjusted to about 0.3 to about 0.7 so that the layer has a sufficiently lower refractive index than the device body, with a diminished lattice constant difference therebetween.

Like the first and third embodiments, the present embodiment is adapted to confine the current and light, while the light-emitting layers 24, 25 of ZnSe are sandwiched between the conductive layers 63, 27 of $ZnS_xSe_{1-x}$ having a greater band gap than ZnSe to confine the carrier to the light-emitting layers. This ensures a high luminescence efficiency. The ZnSe p-n junction electroluminescent device thus realized therefore exhibits high brightness and high efficiency.

According to a sixth embodiment, the light-emitting layers are prepared from $ZnS_zSe_{1-z}$ with a sulfur content (z) of up to 0.5, and the sulfur content of the semiconductors for the conductive layer and the insulating layer is made greater by the value z. Like the fifth embodiment, this embodiment realizes a ZnSSe p-n junction electroluminescent device exhibiting high brightness and high efficiency.

Figure 4:
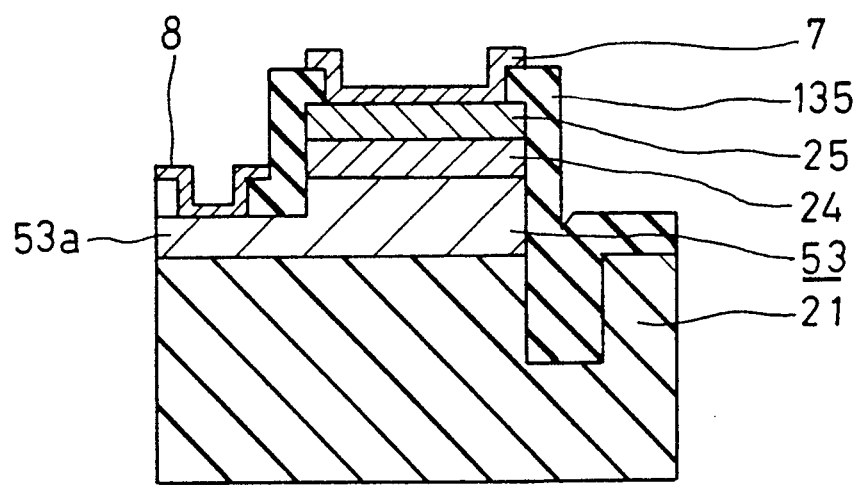

FIG. 4 is a diagram showing a seventh embodiment of the invention.

Indicated at 21 in the drawing is an insulating ZnSe substrate prepared from a ZnSe bulk single crystal grown by the halogen chemical transport process without subjecting the crystal to low-resistance treatment. In the same manner as in the third embodiment, an n-type ZnSe conductive layer 53, an n-type ZnSe light-emitting layer 24 and p-type ZnSe light-emitting layer 25 are epitaxially grown one over another on the insulating ZnSe substrate 21. The grown layer block is then shaped into a column by etching the block until the n-type ZnSe conductive layer 53 is exposed.

Subsequently, the layer block is further shaped into the columnar form along with a portion of the substrate 21 with the conductive layer 53 locally left unetched to obtain a columnar electroluminescent device body and a negative electrode forming portion 53a of the layer 53 extending from the body in the form of a tongue.

Insulating $ZnS_xSe_{1-x}$ having a sulfur content (x) of about 0.3 to about 0.7 is further grown over the resulting product to form an insulating layer 135. The insulating $ZnS_xSe_{1-x}$ portion deposited on the light-emitting layer 25 and the tonguelike portion 53a of the layer 53 is etched away. An Au positive electrode 7 and an In negative electrode 8 are then formed on the exposed surfaces of the light-emitting layer 25 and the tonguelike portion 53a, respectively, whereby a planar p-n junction electroluminescent device is obtained.

The ZnSe p-n junction electroluminescent device fabricated according to this embodiment is of the planar type and exhibits high brightness and high delivery efficiency.

According to an eighth embodiment of the invention, $ZnS_xSe_{1-x}$ is used as the semiconductor for the device body, and the insulating layer 135 is prepared from $ZnS_zSe_{1-z}$ $(x<z)$ having a higher sulfur content than the above $ZnS_xSe_{1-x}$. Like the seventh embodiment, this embodiment realizes a planar p-n junction electroluminescent device exhibiting high brightness and high delivery efficiency.

Thus, the first to eighth embodiments realize compound semiconductor electroluminescent devices which luminesce over the range of ultraviolet rays to visible rays including blue rays with high brightness and high delivery efficiency and which are therefore very useful as high-energy and high-brightness light sources for use in various displays, printers, facsimile systems, etc.

What is claimed is:

1. An electroluminescent device of compound semiconductor, comprising:

a substrate formed of a Group II-VI compound semiconductor;

a device body formed on said substrate and having a substantially columnar configuration extending upwardly from the substrate for emitting light from said device in a direction defined longitudinally along said columnar configuration, said device body comprising a light-emitting portion having an upper surface and a lower surface and a conductive portion joined to at least one of said upper and lower surfaces of the light-emitting portion, said light-emitting portion and said conductive portion of the device body being formed of a Group II-VI compound semiconductor and having at least one impurity element added to said portions to decrease the resistance thereof;

a pair of electrodes for applying an external voltage across said device body so as to cause current flow and electroluminescent emission of light from said device body; and an insulating portion peripherally surrounding said columnar device body, said insulating portion being formed of a Group II-VI compound semiconductor and having a refractive index equal to or lower than the refractive index of at least one of said light-emitting and conductive portions of the device body so as concentrate said current flow longitudinally through the device body and thereby provide enhanced electroluminescent emission of light longitudinally outwardly from said device body.

2. A device as defined in claim 1 wherein the Group II-VI compound semiconductor forming each of the conductive portion and the light-emitting portion is ZnS, ZnSe or $ZnS_xSe_{1-x}$.

3. A device as defined in claim 1 wherein the Group II-VI compound semiconductor forming the insulating portion is ZnS, ZnSe or $ZnS_ySe_{1-y}$.

4. A device as defined in claim 1 wherein the Group II-VI compound semiconductor forming each of the conductive portion and the light-emitting portion is ZnSe, and the Group II-VI compound semiconductor forming the insulating portion is ZnSe or $ZnS_ySe_{1-y}$ ($0.3 < y < 0.7$).

5. A device as defined in claim 1 wherein the Group II-VI compound semiconductor forming the conductive portion is $ZnS_xSe_{1-x}$ ($0.5 > x > 0$), the Group II-VI compound semiconductor forming the light-emitting portion is ZnSe, and the Group II-VI compound semiconductor forming the insulating portion is $ZnS_ySe_{1-y}$ ($y > x + 0.5$).

6. A device as defined in claim 1 wherein the Group II-VI compound semiconductor forming the conductive portion is $ZnS_xSe_{1-x}$ ($x = 0.1$), the Group II-VI compound semiconductor forming the insulating portion is $ZnS_ySe_{1-y}$ ($0.3 < y < 0.7$), and the Group II-VI compound semiconductor forming the light-emitting portion is ZnSe and is smaller than the $ZnS_xSe_{1-x}$ of the conductive portion in forbidden band gap.

7. A device as defined in claim 1 wherein the substrate is made of a conductive ZnS, ZnSe or $ZnS_zSe_{1-z}$.

8. A device as defined in claim 1 wherein the substrate is made of an insulating ZnS, ZnSe or $ZnS_zSe_{1-z}$.

9. A device as defined in claim 1 wherein the insulating portion is made of a conductive or an insulating CaS, CaSe, SrS or SrSe.

10. A device as defined in claim 1 wherein the insulating portion has a wall surrounding the device body and having a thickness of 2 to 10 μm.

11. A device as defined in claim 1 wherein the light-emitting portion is a luminescent layer of the MIS (metal insulator semiconductor) type formed of ZnS or ZnSe having an impurity element added thereto.

12. A device as defined in claim 11 wherein the substrate is a ZnSe substrate having an n-type impurity element added thereto, and the device body comprises a ZnSe conductive layer having an n-type impurity element added thereto, a ZnSe light-emitting layer having an n-type impurity element added thereto, and a hole injecting layer of insulating ZnSe, the component layers of the device body being formed on the substrate over the entire surface of its central portion and being superposed one over another in the order mentioned, the insulating portion surrounding the entire periphery of the device body, one of the electrodes being made of Au and being provided on the hole injecting layer, the other electrode being made of In and being provided on one surface of the substrate opposite to the other surface thereof having the device body formed thereon.

13. A device as defined in claim 1 wherein the light-emitting portion is a luminescent layer of planar structure having a p-n junction formed by the combination of ZnS having a p-type impurity element added thereto, said p-type impurity elements is Group I or V elements, or a combination of Group I and V elements, and ZnS having an n-type impurity element added thereto, said n-type impurity elements is Group III or VII elements, or a combination of Group III and VII elements.

14. A device as defined in claim 1 wherein the light-emitting portion is a luminescent layer of planar structure having a p-n junction formed by the combination of ZnSe having a p-type impurity element added thereto, said p-type impurity elements is Group I or V elements, or a combination of Group I and V elements, and ZnS having an n-type impurity element added thereto, said n-type impurity elements is Group III or VII elements, or a combination of Group III and VII elements.

15. A device as defined in claim 13 wherein the substrate is formed of insulating ZnSe, and the device body comprises a ZnSe conductive layer having an n-type impurity element added thereto, a ZnSe light-emitting layer having an n-type impurity element added thereto, and a ZnSe light-emitting layer having a p-type impurity element added thereto, the component layers of the device body being formed on the substrate at least over the entire surface of its central portion and superposed one over another in the order mentioned, the insulating portion surrounding the device body over the entire periphery thereof except one end portion of the ZnSe conductive layer, one of the electrodes being made of Au and being provided on the p-type ZnSe light-emitting layer.

16. A device as defined in claim 1 wherein the light-emitting portion is a luminescent layer of the MIS type formed of $ZnS_hSe_{1-h}$ ($0.5 > h > 0$) having an n-type impurity element added thereto, said n-type impurity elements is Group III or VII elements, or a combination of Group III and VII elements, and the insulating portion is formed of $ZnS_ySe_{1-y}$ ($y > h + 0.5$) having no impurity element added thereto.

17. A device as defined in claim 1 wherein the conductive portion and the light-emitting portion are identical in shape when seen in a plan view, and the conductive layer is formed on the substrate, the light-emitting portion being formed on the conductive layer and on the substrate with an electrode forming space left locally on the upper surface of the conductive layer, the pair of electrodes being connected to the conductive layer and the light-emitting portion respectively.

18. A device as defined in claim 17 wherein the substrate is formed of insulating ZnSe, and the device body comprises a ZnSe conductive layer having an n-type impurity element added thereto, a ZnSe light-emitting layer having an n-type impurity element added thereto, and a ZnSe light-emitting layer having a p-type impurity element added thereto, the component layers of the device body being formed on the substrate at least over the entire surface of its central portion and superposed one over another in the order mentioned, the insulating portion surrounding the device body over the entire periphery thereof except one end portion of the ZnSe conductive layer, one of the electrodes being made of Au and being provided on the p-type ZnSe light-emitting layer.

19. A device as defined in claim 1 wherein one of the electrodes is connected to the device body, and the other electrode is connected to one surface of the substrate opposite to the other surface thereof having the device body formed thereon.

20. A device as defined in claim 16 wherein the substrate is a ZnSe substrate having an n-type impurity element added thereto, and the device body comprises a ZnSe conductive layer having an n-type impurity element added thereto, a ZnSe light-emitting layer having an n-type impurity element added thereto, and a hole injecting layer of insulating ZnSe, the component layers of the device body being formed on the substrate over the entire surface of its central portion and being superposed one over another in the order mentioned, the insulating portion surrounding the entire periphery of the device body, one of the electrodes being made of Au and being provided on the hole injecting layer, the other electrode being made of In and being provided on one surface of the substrate opposite to the other surface thereof having the device body formed thereon.

* * * * *